United States Patent [19]

Miura et al.

[11] Patent Number: 5,103,275

[45] Date of Patent: Apr. 7, 1992

[54] SEMICONDUCTOR MEMORY

[75] Inventors: Atsushi Miura, Tenri; Tatsushi Yusuki, Nara, both of Japan

[73] Assignee: Sharp Kabushiki Kaisha, Osaka, Japan

[21] Appl. No.: 617,613

[22] Filed: Nov. 26, 1990

[30] Foreign Application Priority Data

Nov. 30, 1989 [JP] Japan .................. 1-311515

[51] Int. Cl.⁵ .......................................... H01L 27/108
[52] U.S. Cl. ..................................... 357/23.6; 365/149; 357/59
[58] Field of Search ............... 357/23.6, 71, 59 F, 357/59 J

[56] References Cited

U.S. PATENT DOCUMENTS 4,700,457  10/1987  Matsukawa .................. 357/23.6 R
4,974,040  11/1990  Toguchi et al. .................. 357/23.6
4,985,718  1/1991  Ishijima .......................... 357/23.6 R

FOREIGN PATENT DOCUMENTS 63-208263  8/1988  Japan ........................ 357/23.6 R Primary Examiner—William D. Larkins
Attorney, Agent, or Firm—Nixon & Vanderhye

[57] ABSTRACT

A semiconductor memory comprising a plurality of memory cells including transistors provided on a semiconductor substrate and capacitors having upper electrodes, insulating films and lower electrodes provided on the transistors, one terminal of the transistor of the memory cell being connected to the lower electrode of the capacitor, wherein the capacitors of the adjacent memory cells are opposed to each other, a part of the capacitors being superposed perpendicularly to the semiconductor substrate.

10 Claims, 11 Drawing Sheets

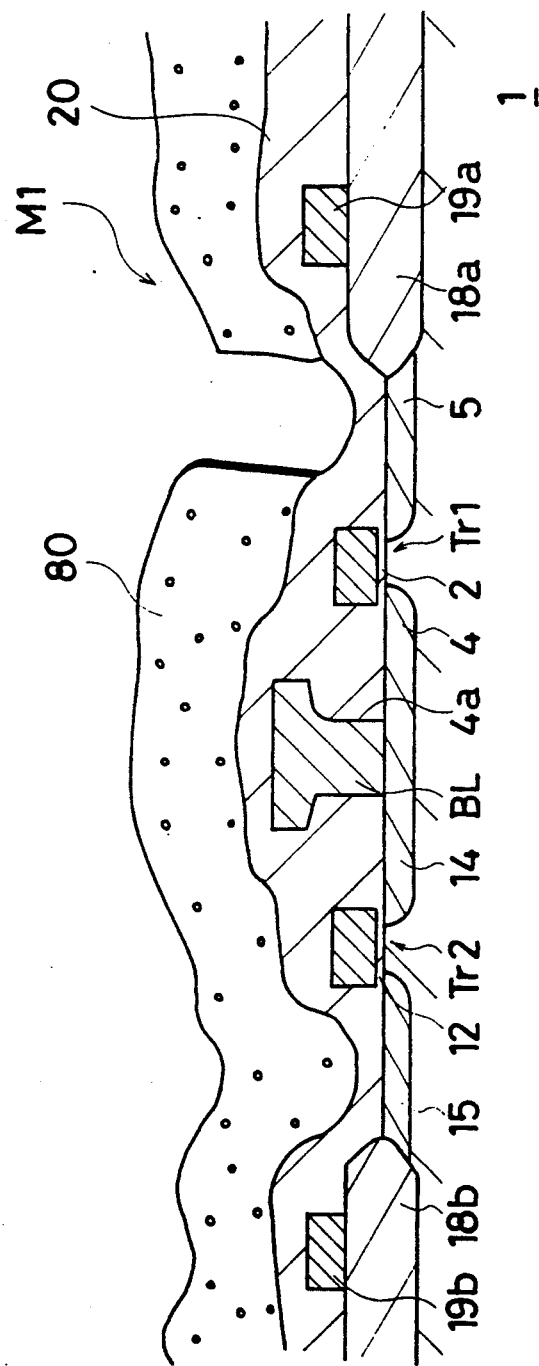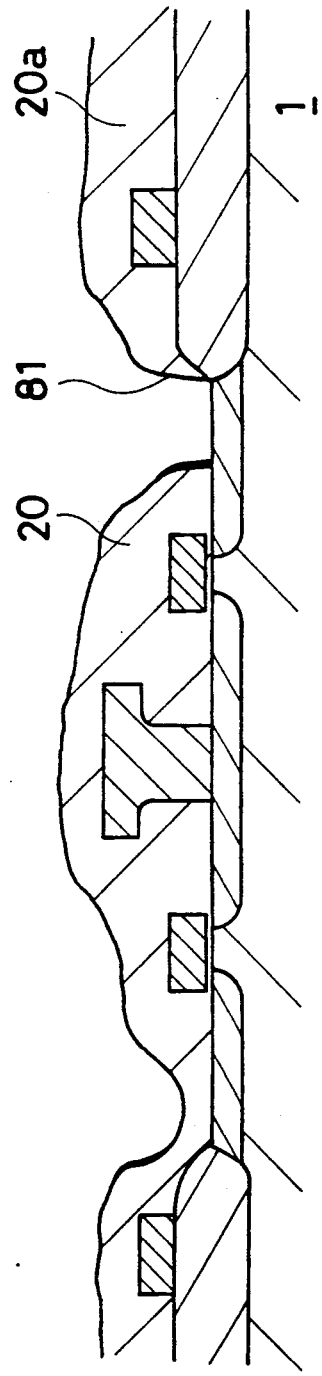
FIG. 2 (a)
FIG. 2 b)

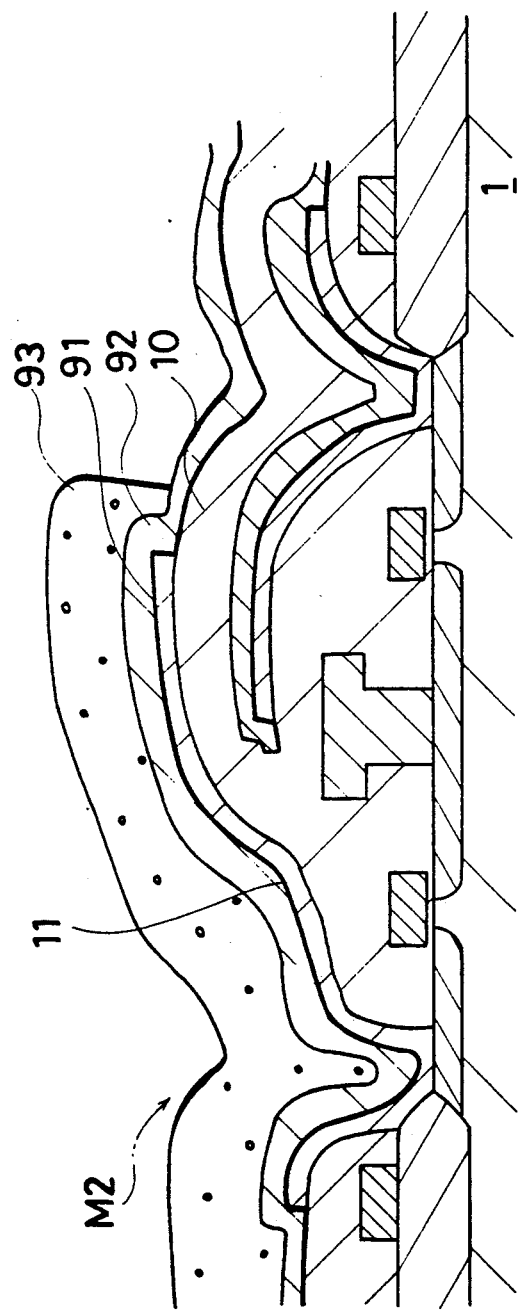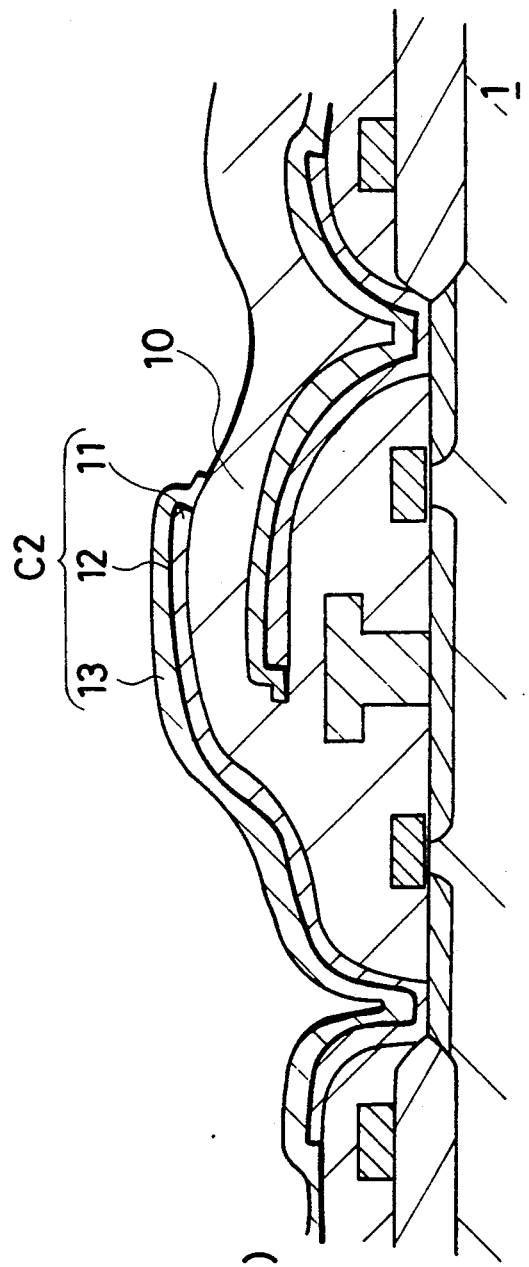
FIG. 2(k)
FIG. 2(l)

SEMICONDUCTOR MEMORY

BACKGROUND OF THE INVENTION

1. Field of the Invention

The present invention relates to a semiconductor memory and more specifically to a semiconductor memory wherein a three-dimensional structure in which a capacitor is laminated on a transistor formed on a surface of a semiconductor substrate, i.e., a stack structure is formed so that an area of a memory cell is made smaller as compared with a case in which the transistor and the capacitor are simply arranged on the surface of the semiconductor substrate in a plane, and in particular, to a semiconductor memory which is useful for increasing a capacity of a capacitor of a DRAM (dynamic random access memory) of which memory cell has a reduced area in order to make integration higher.

2. Description of the Prior Art

Conventionally, there has been proposed a DRAM (dynamic random access memory) shown in FIGS. 5 or 6 as a semiconductor memory having a stack structure of the above type.

The DRAM shown in FIG. 5 has two memory cells (M3) and (M4) provided on a surface of a semiconductor substrate (21). The memory cells (M3) and (M4) are adjacent to each other and have structures symmetrical relative to a bit line (BL). The memory cell (M3) includes a transistor (Tr3) and a capacitor (C3) formed on the transistor (Tr3). The transistor (Tr3) has a drain (24) which is connected to the bit line (BL) through a contact portion (24a), a source (25) which is provided on an oxide film (31) for device isolation side, and a gate oxide film (22) and a gate electrode (23) which cover a region between the drain (24) and the source (25). The capacitor (C3) has a node polysilicon electrode (27) comprised of a node portion (27a) and vane portions (27b) and (27c), an insulating film (28) and a plate electrode (29) which has portions opposite to the node and vane portions of the node polysilicon electrode (27) with the insulating film (28) interposed. The node portion (27a) is connected to the source (25). The vane portion (27b) is extended over the transistor (Tr3), while the vane portion (27c) is extended over a polysilicon wire (32). Thus, a three-dimensional structure (stack structure) in which the capacitor (C3) is laminated on the transistor (Tr3) is formed, so that an area of the memory cell is made smaller as compared with a case in which the transistor (Tr3) and the capacitor (C3) are simply arranged on the surface of the semiconductor substrate (21) in a plane. The reference numerals (26), (30) and (33) denote layer insulating films. A drain (34) of a transistor (Tr4) of the memory cell (M4) is common to the drain (24) of the transistor (Tr3).

A DRAM shown in FIG. 6 comprises two memory cells (M5) and (M6) which are adjacent to each other and have structures symmetrical relative to the contact portion (24a) of the bit line (BL) in similar to the DRAM shown in FIG. 5. The memory cell (M5) includes a transistor (Tr5) and a capacitor (C5). The memory cell (M6) includes a transistor (Tr6) and a capacitor (C6). The capacitors (C5) and (C6) have structures symmetrical to each other. For example, a node polysilicon electrode (47) of the capacitor (C5) has a node portion (47a) which is perpendicular to a surface of a substrate (41), and a pair of vane portions (47b) and (47c) and a pair of vane portions (47d) and (47e). The vane portions (47b) and (47c), and (47d) and (47e) cross the node portion (47a) and have two layers which are almost parallel with the surface of the substrate (41) in up and down directions, respectively. The node portion (47a) is connected to a source (45). The vane portions (47d) and (47e) are extended over the transistor (Tr5). The vane portions (47b) and (47c) are extended over the polysilicon wire (32). A plate electrode (49) is opposed to the node portion (47a) and vane portions (47b), (47c), (47d) and (47e) of the node polysilicon electrode (47) through an insulating film (48) shown in a heavy line of FIG. 6. Thus, the transistor (Tr5) and the capacitor (C5) have a stack structure in similar to the DRAM shown in FIG. 5, so that the area of the memory cell is reduced. Furthermore, since the electrodes (47) and (49) of the capacitor (C5) are opposed to each other through the insulating film (48), electrode opposed areas of the electrodes (47) and (49) are made larger so as to increase a capacity.

However, if the area of the memory cell is reduced in order to make integration higher in the conventional DRAM, the memory cells shown in FIGS. 5 and 6 cause the electrode opposed areas of the capacitors to be reduced. Consequently, there is caused a problem that the capacity of the capacitor becomes insufficient.

It is an object of the present invention to provide a semiconductor memory capable of keeping a larger electrode opposed area of a capacitor forming a memory cell so as to keep a larger capacity of the capacitor even if an area of the memory cell is reduced in order to make the integration higher.

SUMMARY OF THE INVENTION

The present invention provides a semiconductor memory comprising a plurality of memory cells including transistors provided on a semiconductor substrate and capacitors having upper electrodes, insulating films and lower electrodes provided on the transistors, one terminal of the transistor of the memory cell being connected to the lower electrode of the capacitor, wherein the capacitors of the adjacent memory cells are opposed to each other, a part of the capacitors being superposed perpendicularly to the semiconductor substrate.

DETAILED DESCRIPTION OF PREFERRED EMBODIMENTS

A semiconductor memory of the present invention is characterized by a structure wherein a plurality of adjacent memory cells formed by laminating capacitors on transistors have a part of the capacitors superposed perpendicularly to a surface of a semiconductor substrate.

According to the present invention, the transistor and capacitor formed on the surface of the semiconductor substrate are the same as conventional ones. In addition, the semiconductor memory is of a stack type having a three-dimentional structure in which the capacitor is laminated on the transistor similar to a conventional example.

Figure 1:
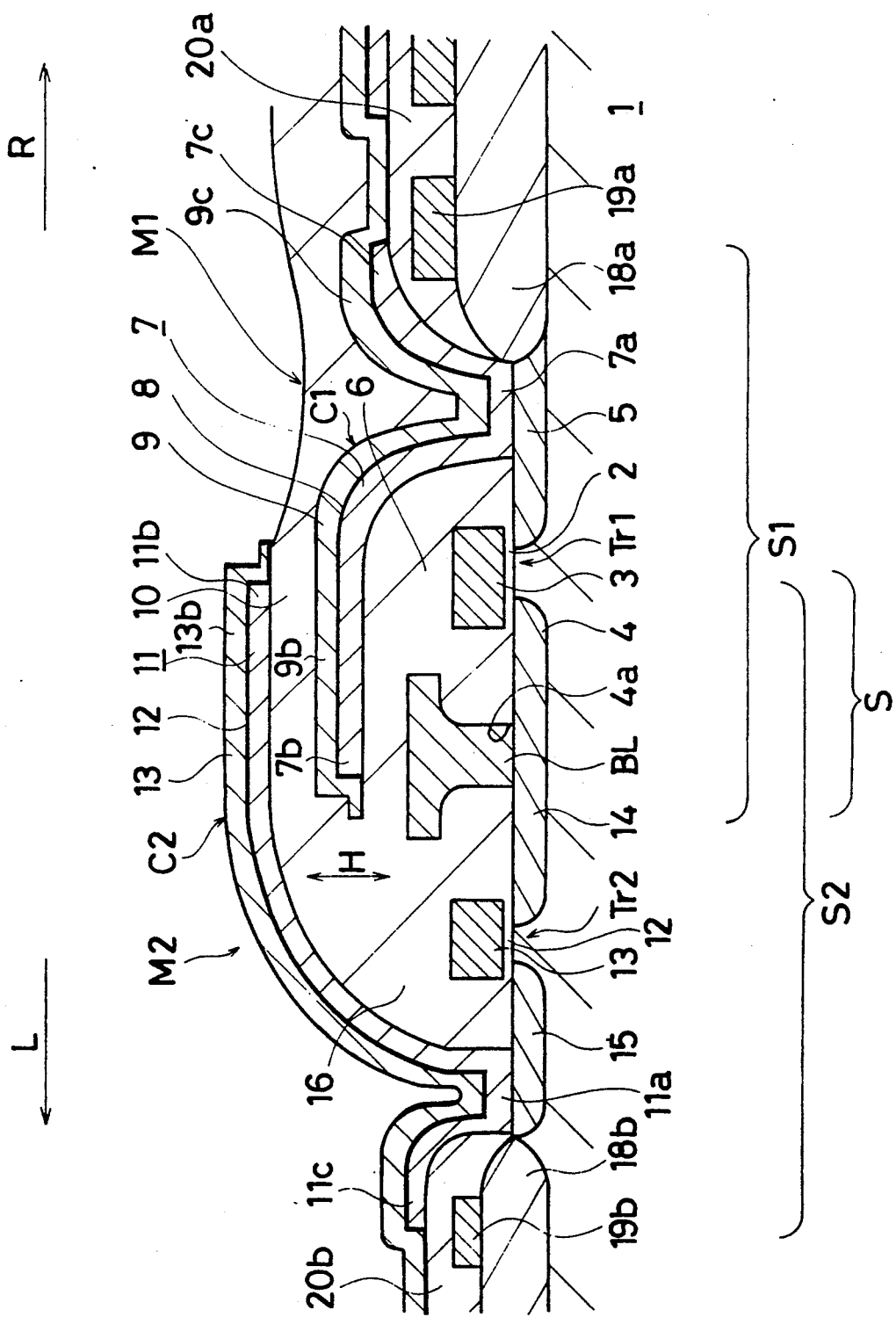
FIG. 1 is a view for explaining a structure of a semiconductor memory according to a first embodiment of the present invention.

In other words, as shown in FIG. 1, a transistor (Tr1) comprises a drain (4) which is connected to a bit line (BL) in a contact portion (4a), a source (5) which is provided on an oxide film (18a) for device isolation side, and a gate oxide film (2) and a gate electrode (3) which cover a region between the drain (4) and the source (5). On the other hand, as shown in FIG. 1, a capacitor (C1) comprises a node electrode (lower electrode) (7), an insulating film (8) and a plate electrode (upper electrode) (9). The node electrode (7) includes a node portion (7a) which is erected on the surface of the semiconductor substrate, and node vane portions (7b) and (7c). The node vane portions (7b) and (7c) are extended by branching from the node portion (7a) like a vane in a direction in which a memory cell (M2) is provided adjacently to a memory cell (M1) (a direction of an arrow (L) parallel with the surface of the semiconductor substrate) and an opposite direction (a direction of an arrow (R)). The plate electrode (9) includes a plate portion (9a) and plate vane portions (9b) and (9c) which are provided opposite to the node portion (7a) and node vane portions (7b) and (7c) of the node electrode (7) with the insulating film (8) interposed. The node portion (7a) is connected to the source (5). The node vane portion (7b) is extended over the transistor (Tr1). The node vane portion (7c) is extended over a gate wire (19a) which is provided on the oxide film (18a) for device isolation.

However, the present inventor has found that the semiconductor memory having a stack structure will cause a conventional problem to be solved. In other words, according to a conventional semiconductor memory, if an area of a memory cell is reduced in order to make integration higher, electrode opposed areas of all the capacitors in the memory cells are reduced.

According to the present invention, the capacitors of the adjacent memory cells are opposed to each other. In addition, a part of the capacitors is superposed perpendicularly to the semiconductor substrate (in a direction of an arrow (H)). Consequently, it becomes possible to extend a part of the capacitors in almost parallel with the surface of the semiconductor substrate and beyond individual memory cell regions.

By way of example, FIG. 1 shows regions (S1) and (S2) of the two adjacent memory cells (M1) and (M2). In FIG. 1, the electrodes of the capacitors are extended beyond the individual memory cell regions (S1) and (S2) so as to form a superposition region (S) in which the node vane portion (7b) and a node vane portion (11b) are superposed in the direction of the arrow (H) between the capacitors (C1) and (C2).

More specifically, it is preferred that the node vane portion (7b) of the capacitor (C1) is extended from the transistor (Tr1) side to the memory cell region (S2) side of the bit line (BL), while the node vane portion (11b) of the capacitor (C2) is extended over the gate wire (19a). In addition, it is preferred that the node vane portion (11b) of the capacitor (C2) is extended from the transistor (Tr2) side to the memory cell region (S1) side of the bit line (BL), while a node vane portion (11c) is extended over a gate wire (19b). In this case, the node vane portions (7b) and (11b) which are provided in the superposition region (S) are extended longer from the node portions (7a) and (11a) in (L) and (R) directions than the node vane portions (7c) and (11c) which are not provided in the region (S). Consequently, it is possible to at least realize the increase in electrode area of the capacitor corresponding to the increase in extension in the region (S).

Accordingly, the present invention is especially effective in reducing the areas of the individual memory cells (M1) and (M2) in order to make the integration higher. In addition, according to the present invention, the electrode opposed area and capacity of the capacitor can be kept greater.

Of course, since the electrodes of the capacitor are superposed perpendicularly to the surface of the semiconductor substrate according to the present invention, the capacity of the capacitor can also be kept greater even if the area of the memory cell is not reduced.

According to the present invention, in a case in which the electrodes of the capacitor are superposed perpendicularly to the surface of the semiconductor substrate, layer insulating films are interposed between the electrodes of the capacitors of the adjacent memory cells so that a short-circuit is prevented.

The capacitor of the present invention includes upper electrodes, insulating films and lower electrodes.

(i) As shown in FIG. 1, the vane portions opposite to each other are provided through the layer insulating film within the superposition region (S) in up and down directions.

Figure 3:
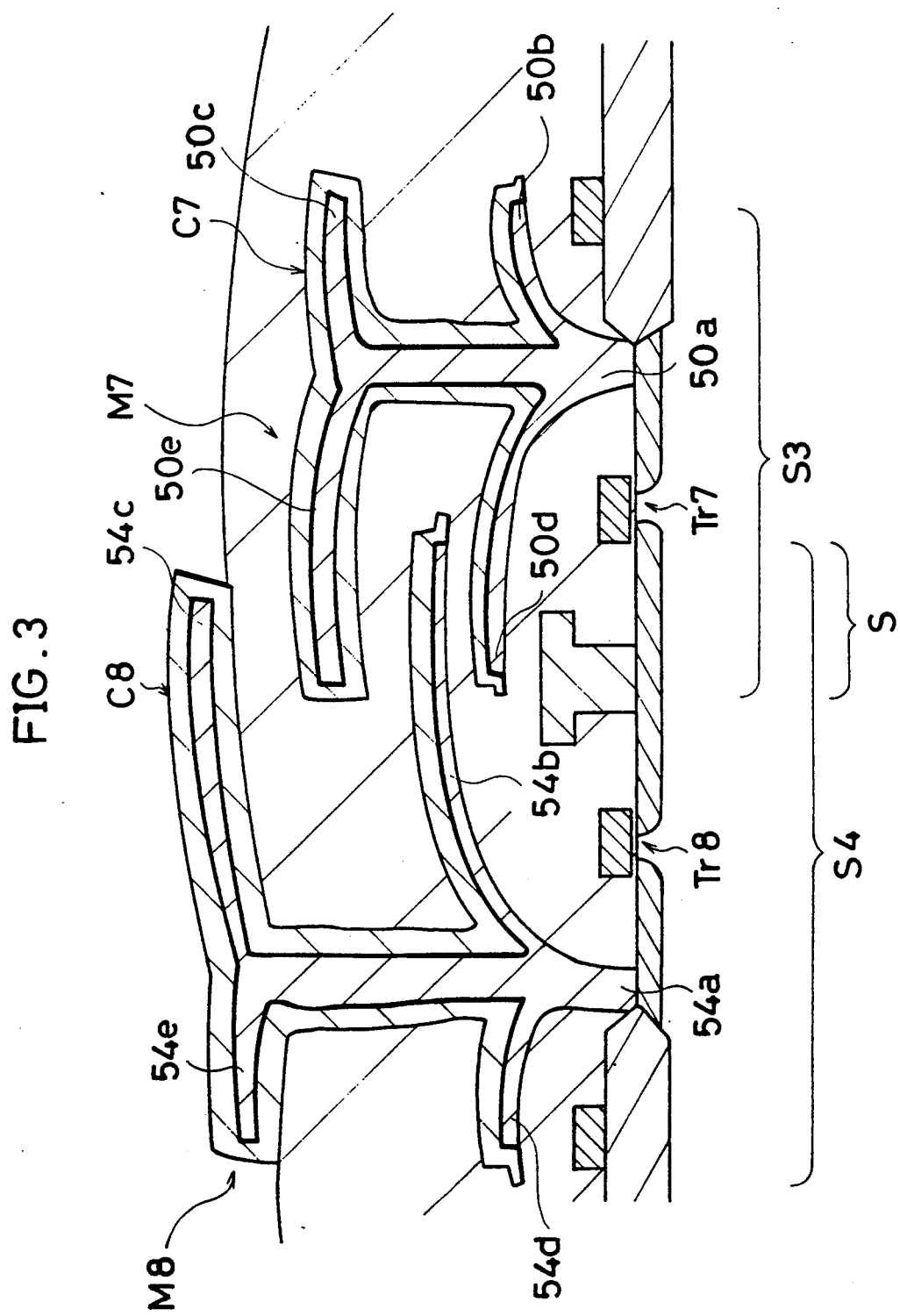
FIG. 3 is a view for explaining a structure of a semiconductor memory according to a second embodiment of the present invention.
Figure 4:
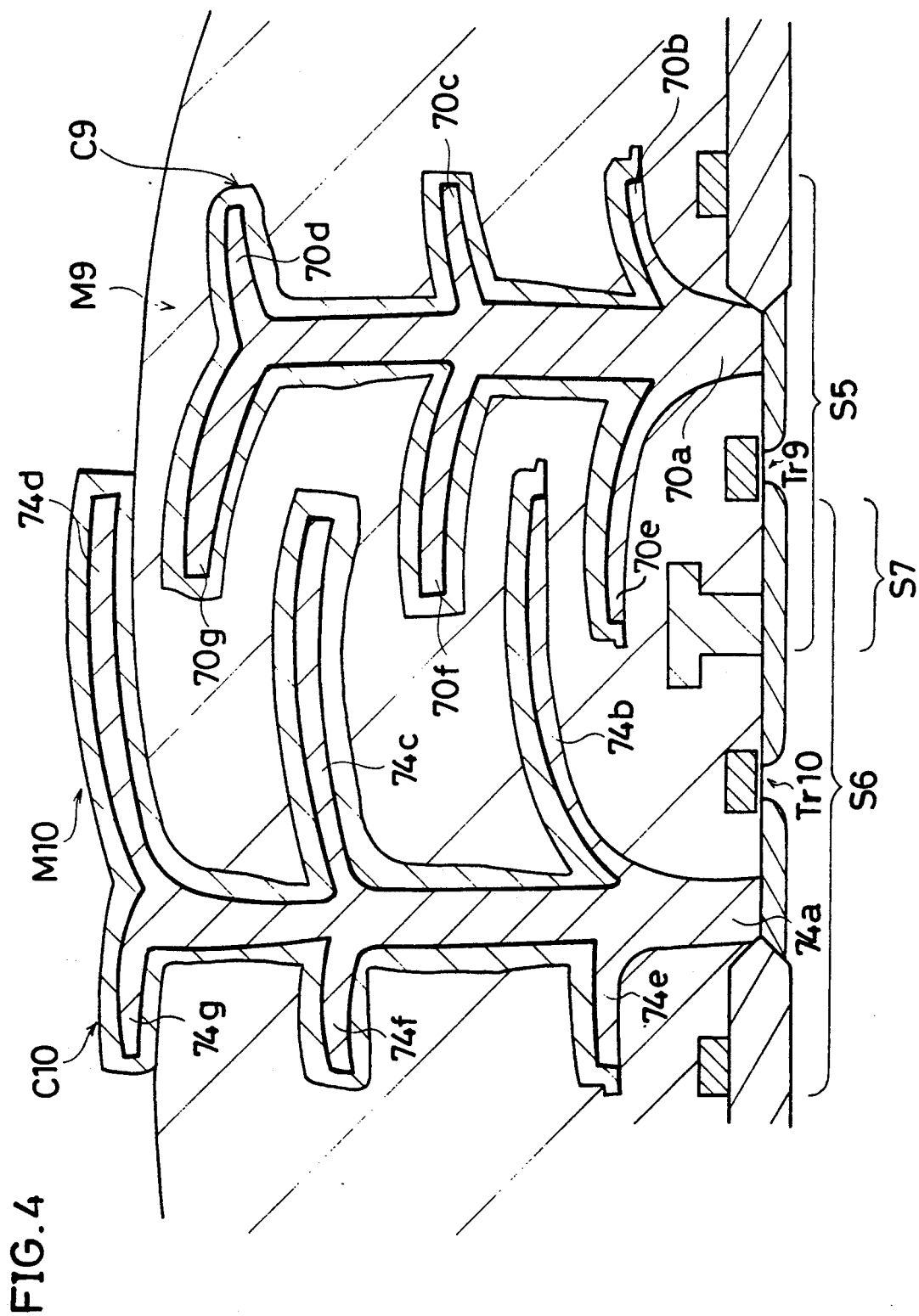
FIG. 4 is a view for explaining a structure of a semiconductor memory according to a third embodiment of the present invention.
Figure 5:
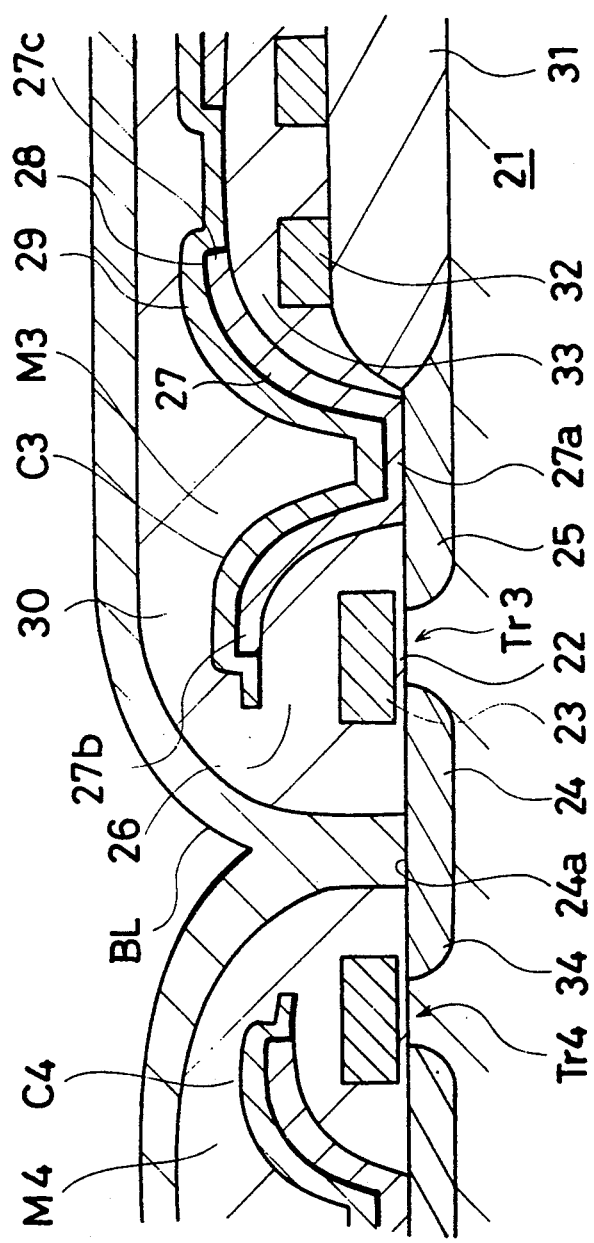
FIGS. 5 and 6 are views showing semiconductor memories according to conventional examples, respectively.
Figure 6:
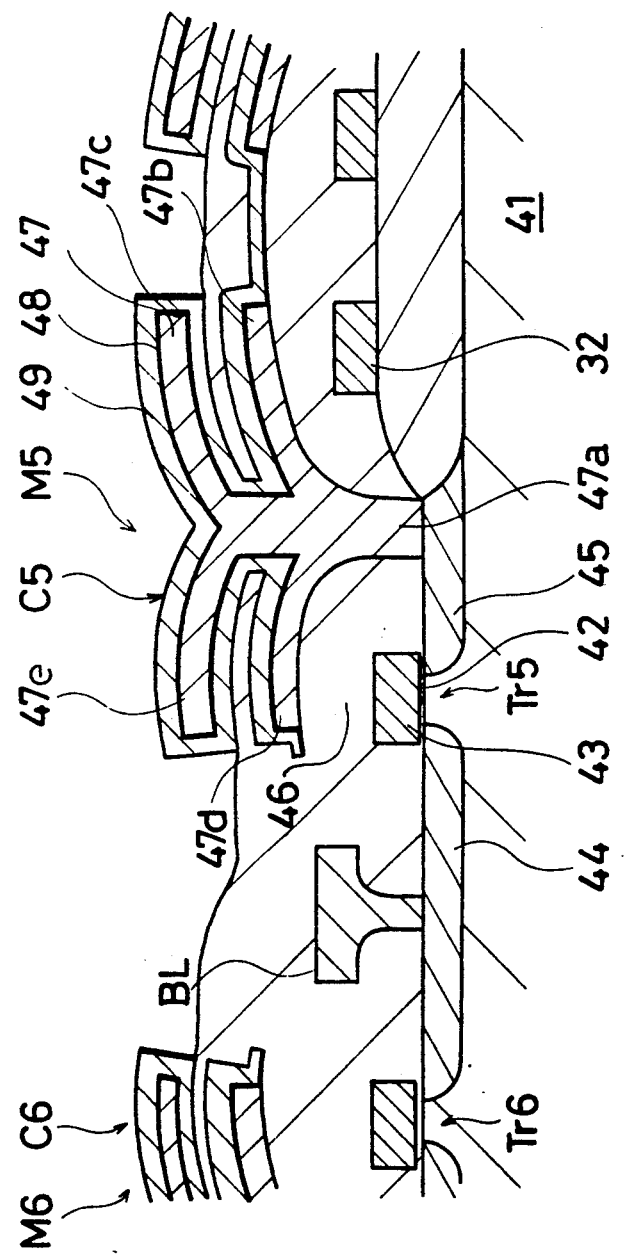

(ii) As shown in FIGS. 3 and 4, a plurality of vane portions of the capacitor are provided apart from one another in the up and down directions. In addition, the vane portions opposite to each other are alternately provided through the layer insulating films in the superposition region between the capacitors of the memory cells adjacent to each other, respectively.

In other words, the capacitors (C7) and (C8) shown in FIG. 3 have node vane portions (50b) to (50e) and (54b) to (54e) formed apart from each other in the up and down directions and in two steps right and left, respectively. The capacitors (C9) and (C10) shown in FIG. 4 have node vane portions (70b) to (70g) and (74b) to (74g) formed apart from one another in the up and down directions and in three steps right and left.

Furthermore, the node vane portions having four steps or more can suitably be used.

In FIGS. 3 and 4, (M7) to (M10) denote memory cells, (Tr7) to (Tr10) denote transistors, (S3) to (S6) denote memory cell regions, and (S) denotes a superposition region of capacitor electrodes.

A semiconductor memory according to the present invention will be described in detail with reference to the drawings.

As shown in FIG. 1, the semiconductor memory comprises memory cells (M1) and (M2) connected to a bit line (BL) and adjacent to each other on a surface of a semiconductor substrate (1). The memory cell (M1) includes a transistor (Tr1) and a capacitor (C1). The memory cell (M2) includes a transistor (Tr2) and a capacitor (C2). The transistor (Tr1) has a drain (4) which is connected to the bit line (BL) in a contact portion (4a), a source (5) which is provided on an oxide film (18a) for device isolation side, and a gate oxide film (2) and a gate electrode (3) which cover a region between the drain (4) and the source (5). The transistor (Tr2) has a drain (14), a source (15) which is provided on an oxide film (18b) for device isolation side, and a gate oxide film (12) and a gate electrode (13) which cover a region between the drain (14) and the source (15). The transistor (Tr2) is formed symmetrically to the transistor (Tr1) relative to the contact portion (4a) of the bit line (BL). In addition, the drain (4) of the transistor (Tr1) of the memory cell (M1) is common with the drain (14) of the transistor (Tr2) of the memory cell (M2).

The capacitor (C1) includes a node electrode (7), an insulating film (8) and a plate electrode (9). The node electrode (7) has a node portion (7a), and node vane portions (7b) and (7c). The plate electrode (9) has portions opposed to the node portion (7a) and node vane portions (7b) and (7c) of the node polysilicon electrode (7) with the insulating film (8) interposed. Similarly, the capacitor (C2) includes a node electrode (11), an insulating film (12) and a plate electrode (13). The node electrode (11) has a node portion (11a), and node vane portions (11b) and (11c). The plate electrode (13) has portions opposed to the node portion (11a) and node vane portions (11b) and (11c) of the node polysilicon electrode (11) with the insulating film (12) interposed. The vane portion (7b) of the node electrode (7) of the capacitor (C1) is extended from the transistor (Tr1) side to the memory cell (M2) region side of the bit line (BL). The vane portion (7c) is extended from the source (5) of the transistor (Tr1) over a gate wire (19a) provided on an oxide film (18a) for device isolation. The vane portion (11b) of the node electrode (11) of the capacitor (C2) is extended from the transistor (Tr2) to the memory cell (M1) region side of the bit line (BL). The vane portion (11c) is extended from the source (15) of the transistor (Tr2) over a gate wire (19b) provided on an oxide film (18b) for device isolation. The electrodes (7) and (9) of the capacitor (C1) are superposed on the electrodes (11) and (13) of the capacitor (C2) through a layer insulating film (10) perpendicularly to the surface of the semiconductor substrate (1) in the direction of the arrow (H). Accordingly, the electrodes of the capacitors (C1) and (C2) can be extended to the memory cell regions adjacent to each other without causing a short-circuit between the electrodes. Consequently, even if areas of the individual memory cells (M1) and (M2) are reduced in order to make the integration higher, it is not required to reduce an electrode opposed area of the capacitor any longer. In other words, the area of the electrode of the capacitor can be kept larger. In addition, a capacity of the capacitor can be kept greater.

A method of manufacturing the semiconductor memory will be described below in detail.

As shown in FIG. 2(a), a SiO₂ film (20) and a photoresist film are laminated on an entire surface of a Si substrate (1) having transistors (Tr1) and (Tr2), sources (5) and (15), drains (4) and (14), oxide films (18a) and (18b) for device isolation, gate wires (19a) and (19b), and a bit line (BL), and then a photoresist pattern (80) for forming a contact hole of the memory cell (M1) is formed.

Next, a contact hole (81) is formed by means of photolithography so as to remove the pattern (80) [see FIG. 2(b)].

Figure 2C:
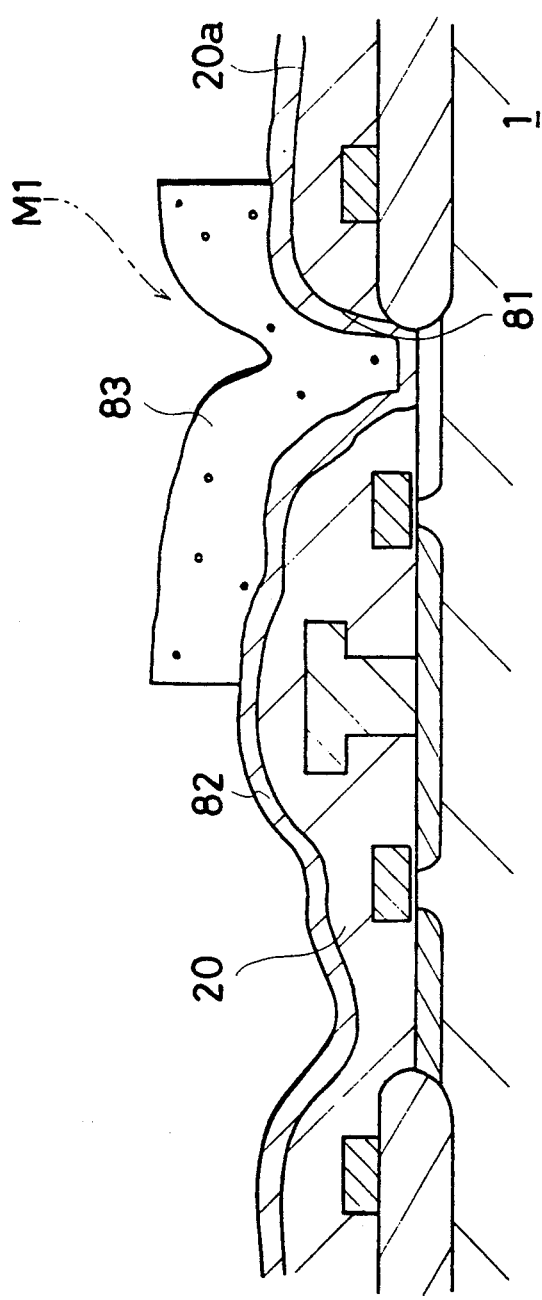
FIGS. 2a and 2b are view for explaining a process of manufacturing the semiconductor memory according to the first embodiment of the present invention.

Subsequently, a polysilicon layer (82) and a photoresist film are laminated on the entire surface of the Si substrate including the contact hole (81) and then a photoresist pattern (83) for forming a node electrode of a capacitor in the memory cell (M1) is formed [see FIG. 2(c)].

Figure 2D:
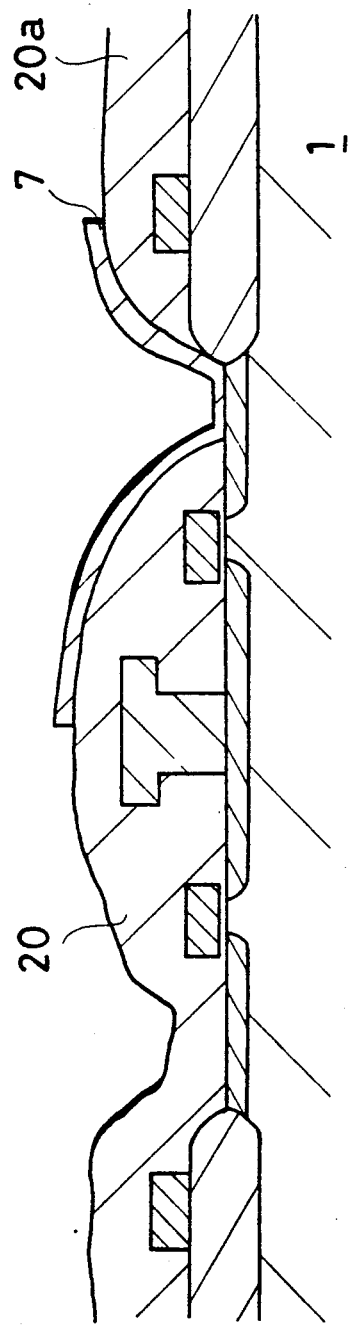

A node electrode (7) is formed by means of the photolithography [see FIG. 2(d)].

Figure 2E:
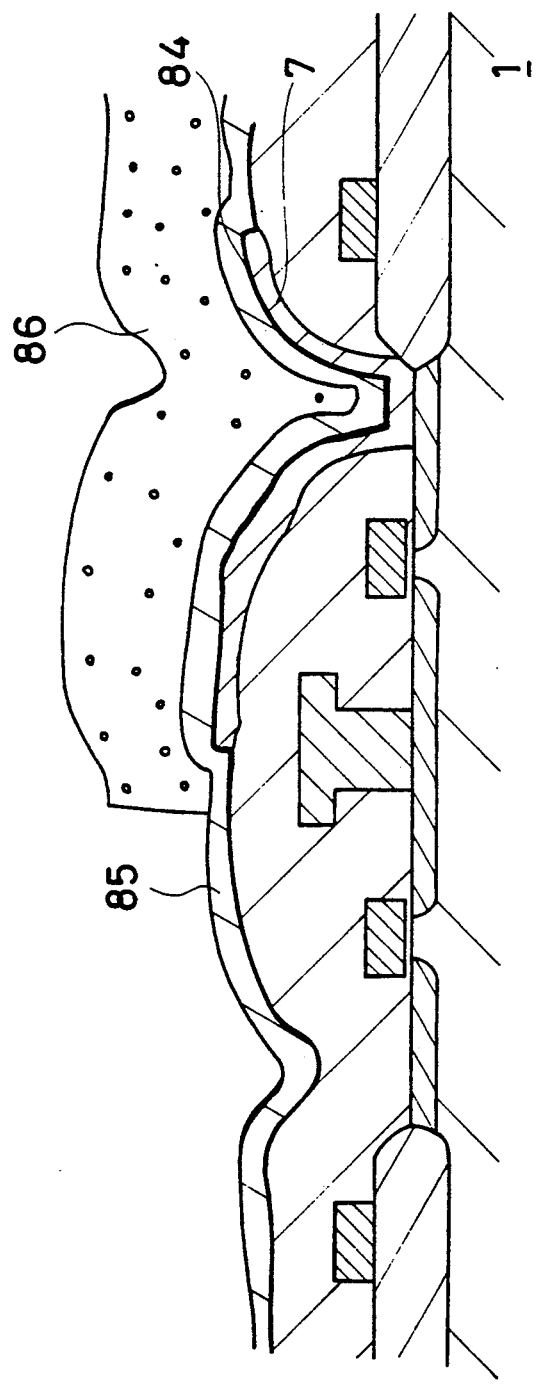

A SiO₂ film (84), a polysilicon film (85) and a photoresist film are laminated on the entire surface of the Si substrate including the node electrode (7) and then a photoresist pattern (86) for forming an insulating film and a plate electrode of the capacitor in the memory cell (M1) is formed [see FIG. 2(e)].

Figure 2F:
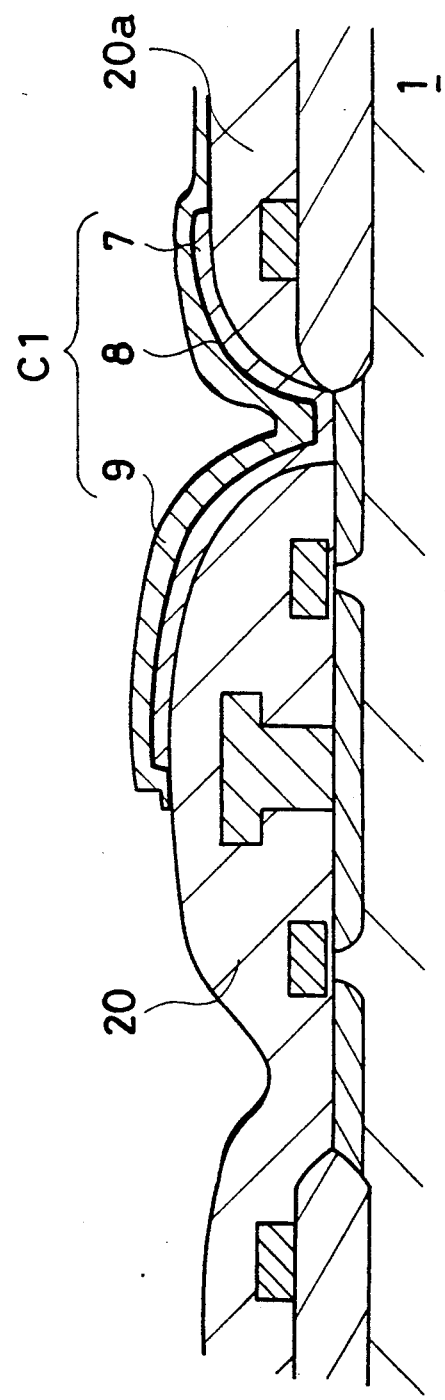

An insulating film (8) and a plate electrode (9) of the capacitor are formed by means of the photolithography so as to form a capacitor (C1) and remove the photoresist pattern (86) [see FIG. 2(f)].

Figure 2G:
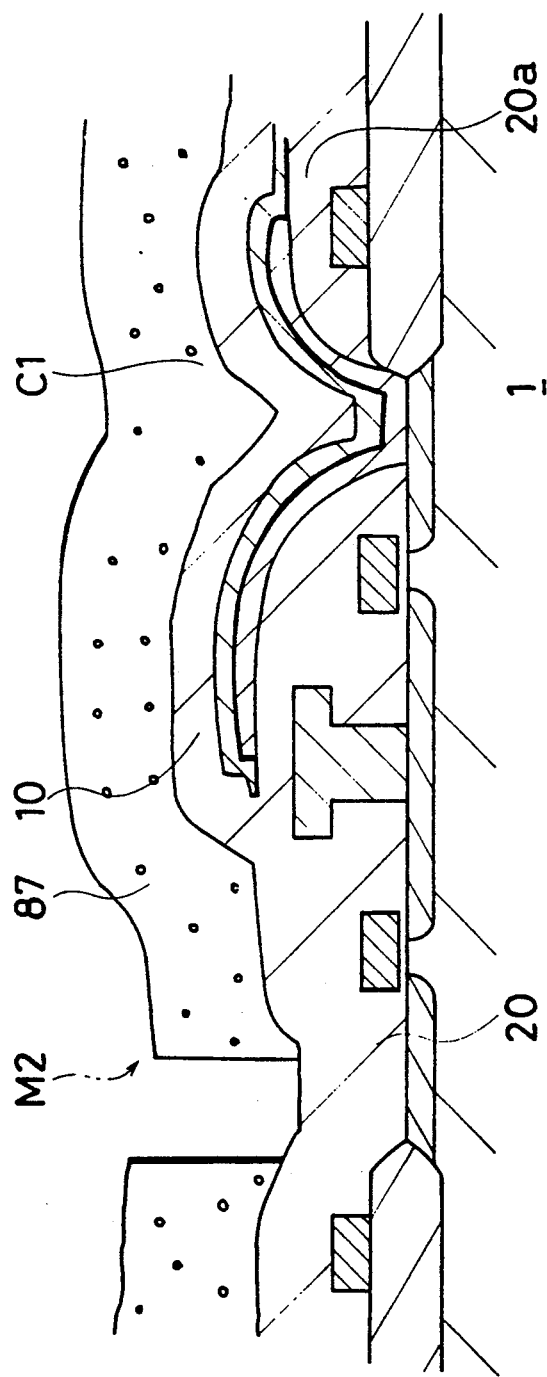

A SiO₂ film (10) and a photoresist film are laminated on the entire surface of the Si substrate including the capacitor (C1) and then a photoresist pattern (87) for forming a contact hole in the memory cell (M2) is formed [see FIG. 2(g)].

Figure 2H:
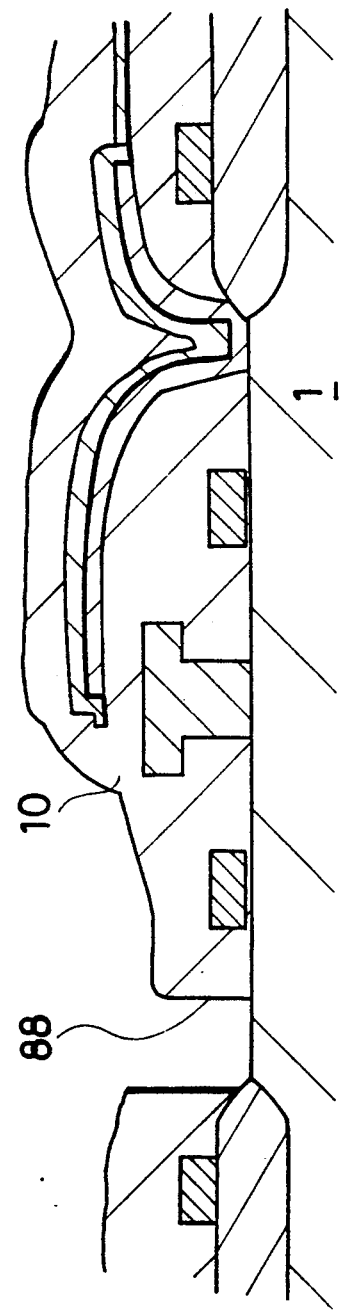

Then, a contact hole (88) is formed by means of the photolithography so as to remove the pattern (87) [see FIG. 2(h)].

Figure 2I:
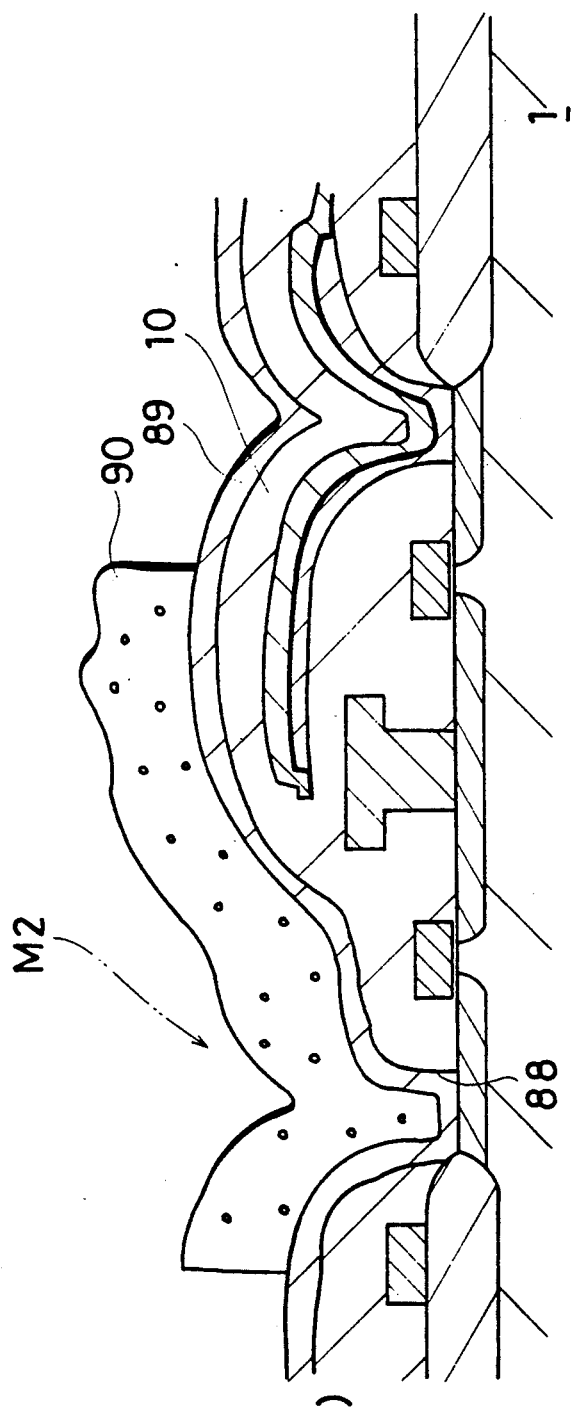

Subsequently, a polysilicon layer (89) and a photoresist film are laminated on the entire surface of the Si substrate including the contact hole (88) and then a photoresist pattern (90) for forming a node electrode of the capacitor in the memory cell (M2) is formed [see FIG. 2(i)].

Figure 2J:
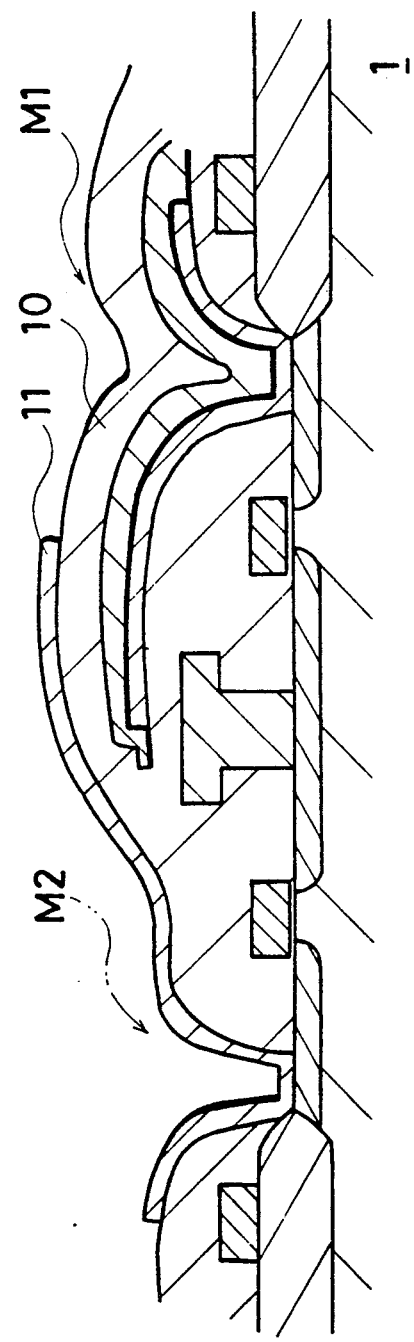

A node electrode (11) is formed by means of the photolithography [see FIG. 2(j)].

Thereafter, a SiO₂ film (91), a polysilicon film (92) and a photoresist film are laminated on the entire surface of the Si substrate including the node electrode (11) and then a photoresist pattern (93) for forming an insulating film and a plate electrode of the capacitor in the memory cell (M2) is formed [see FIG. 2(k)].

An insulating film (12) and a plate electrode (13) of the capacitor are formed by means of the photolithography so as to form a capacitor (C2) and remove the photoresist pattern (93) [see FIG. 2(l)].

Thus, a DRAM having a stack structure is formed.

As is clear from the above-mentioned matter, a semiconductor memory of the present invention comprises a plurality of memory cells including transistors formed on a surface of a semiconductor substrate and capacitors formed by electrodes opposite to each other on the surface of the semiconductor substrate, wherein one of the electrodes of the capacitor is connected to one terminal of the transistor. The electrodes of the capacitors of the memory cells adjacent to each other are superposed perpendicularly to the surface of the semiconductor substrate. Therefore, even if an area of the memory cell is reduced in order to make the integration higher, an area of the electrode of the capacitor can be kept larger. Consequently, the capacity of the capacitor can be kept greater.

What is claimed is:

1. A semiconductor memory comprising a plurality of adjacent memory cells each including a transistor provided on a semiconductor substrate and a capacitor coupled to the transistor, each capacitor having an upper electrode, an insulating film and a lower electrode, one terminal of each of the transistors of the memory cells being connected to the lower electrode of a capacitor associated therewith, wherein the capacitors of the adjacent memory cells are opposed to each other, a part of the capacitors being superposed perpendicularly to the semiconductor substrate, said opposing capacitors being electrically isolated from one another and not sharing any common electrode between them.

2. A semiconductor memory according to claim 1 wherein the memory cell is of a stack type having a three-dimentional structure.

3. A semiconductor memory according to claim 2 wherein a plurality of node vane portions are provided for one node portion, the respective node vane portions being superposed on the opposite node vane portions of the adjacent capacitor perpendicularly to the semiconductor substrate.

4. A semiconductor memory according to claim 2 wherein the node vane portions are superposed on the opposite node vane portions of the adjacent capacitor through layer insulating films.

5. A semiconductor memory according to claim 1 wherein the lower electrode has a node portion and node vane portions which branch from the node portion and are extended in parallel with the semiconductor substrate toward respective adjacent capacitors; and wherein the upper electrode is opposed to the lower electrode via the insulating film.

6. A semiconductor memory according to claim 1 wherein the lower electrode has a node portion and node vane portions which branch from the node portion and are extended in parallel with the semiconductor substrate toward respective adjacent capacitors; wherein the upper electrode is opposed to the lower electrode via the insulating film; and wherein a bit line is located below the node vane portions.

7. A semiconductor memory according to claim 4 wherein the insulating film of the capacitor is formed at least on both upper and lower sides of the node vane portions.

8. A semiconductor memory comprising:
a semiconductor substrate having a planar surface;
a first memory cell including:
a first transistor provided on said semiconductor substrate, said first transistor having a terminal, and
a first elongated capacitor structure coupled to said first transistor terminal, said first capacitor structure comprising first and second elongated electrodes separated by an insulating film, said first elongated capacitor structure including a portion disposed substantially parallel to said substrate planar surface;
a second memory cell adjacent to said first memory cell, said second memory cell including:
a second transistor provided on said semiconductor substrate, said second transistor having a terminal, and
a second elongated capacitor structure coupled to said second transistor terminal, said second capacitor structure having first and second electrodes separated by an insulating film, said second elongated capacitor structure having a portion which is disposed substantially parallel to said substrate planar surface; and
an insulating layer disposed between said first and second elongated capacitor structures, said insulating layer electrically isolating said first and second capacitor structures from one another,
wherein said first and second capacitor portions are substantially parallel to and oppose one another and are spaced apart from one another in a dimension perpendicular to the semiconductor substrate surface.

9. A semiconductor memory according to claim 8, wherein the lower electrode has a node portion and node vane portions which branch from the node portion and are extended in parallel with the semiconductor substrate toward respective adjacent capacitors; and wherein the upper electrode is opposed to the lower electrode via the insulating film.

10. A semiconductor memory according to claim 8 wherein the lower electrode has a node portion and node vane portions which branch from the node portion and are extended in parallel with the semiconductor substrate toward respective adjacent capacitors; wherein the upper electrode is opposed to the lower electrode via the insulating film; and wherein a bit line is located below the node vane portions.

* * * * *